United States Patent
Han et al.

(10) Patent No.: US 6,623,595 B1
(45) Date of Patent: Sep. 23, 2003

(54) WAVY AND ROUGHENED DOME IN PLASMA PROCESSING REACTOR

(75) Inventors: Nianci Han, San Jose, CA (US); Hong Shih, Walnut, CA (US); Li Xu, San Jose, CA (US); Yan Ye, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/536,478

(22) Filed: Mar. 27, 2000

(51) Int. Cl.[7] .............................. C23F 1/00; C23C 16/00
(52) U.S. Cl. ............................... 156/345.1; 118/723 R; 118/723 I; 118/723 AN; 118/723 MW; 156/345.41; 156/345.48
(58) Field of Search .................... 118/723 I, 723 IR, 118/723 AN, 723 R, 723 MW, 723 ME, 723 MR, 723 MA, 723 E, 723 ER; 156/345, 345.1, 345.41, 345.43, 345.47, 345.48

(56) References Cited

U.S. PATENT DOCUMENTS

| | | | | |
|---|---|---|---|---|
| 5,456,757 A | * | 10/1995 | Aruga et al. ............. | 118/723 E |
| 5,609,690 A | * | 3/1997 | Watanabe et al. ......... | 118/723 E |
| 5,753,044 A | | 5/1998 | Hanawa et al. ........... | 118/723 I |
| 5,990,017 A | | 11/1999 | Collins et al. .............. | 438/714 |
| 6,006,694 A | * | 12/1999 | DeOrnellas et al. ...... | 118/723 I |
| 6,007,673 A | * | 12/1999 | Kugo et al. ................. | 156/345 |
| 6,024,826 A | | 2/2000 | Collins et al. .............. | 156/345 |
| 6,074,488 A | * | 6/2000 | Roderick et al. ......... | 118/723 E |
| 6,287,981 B1 | * | 9/2001 | Kim et al. ................... | 438/729 |
| 6,447,853 B1 | * | 9/2002 | Suzuki et al. .............. | 427/585 |
| 2002/0011215 A1 | * | 1/2002 | Tei et al. ............ | 118/723 MW |

FOREIGN PATENT DOCUMENTS

JP          11176593      *  7/1999

* cited by examiner

*Primary Examiner*—Luz L. Alejandro
(74) *Attorney, Agent, or Firm*—Charles S. Guenzer; Joseph Bach

(57) ABSTRACT

A ceramic dome for in a plasma processing chamber having an RF coil disposed outside of said dome. The interior of the dome is formed with macroscopic grooves, and the grooves are roughened into a microscopic structure. The roughening provides increased adhesion to a residue film deposited on the dome during plasma processing. The macroscopic grooves increase the effective area of the dome and thus decreases the thickness of deposited film. The grooves may be formed by machining a green form of the ceramic material cast prior to sintering. The roughening may be formed by bead blasting the machined green form. Thereafter, the green form is fired to form a sintered ceramic dome.

11 Claims, 2 Drawing Sheets

WAVY AND ROUGHENED DOME IN PLASMA PROCESSING REACTOR

FIELD OF THE INVENTION

The invention relates generally to plasma processing reactors. In particular, the invention relates to controlled texturing of a domed roof in an etch reactor.

BACKGROUND ART

A new class of plasma reactors has recently emerged for processing of semiconductors wafers during the fabrication of integrated circuits. These reactors include an RF inductive coil positioned in back of a dome or roof overlying the wafer being processed. An RF power source is connected to the coil to couple inductive energy into the plasma reaction chamber and to create a plasma source region remote from the wafer being process. Because of the separation between the wafer and the plasma source region, some of these reactors are sometimes referred to as having a decoupled plasma source (DPS). Hanawa et al. disclose a number of domed configurations in U.S. Pat. No. 5,753,044. One of these designs has been incorporated into the DPS Etch Reactor available from Applied Materials, Inc. of Santa Clara, Calif. primarily for etching metal and polysilicon. A similar design has been commercially applied to high-density plasma (HDP) chemical vapor deposition. Collins et al. in U.S. Pat. No. 6,024,826 describe a related design having a planar roof and configured for etching oxide.

Shih et al. disclose the details of the chamber wall configuration for the DPS Etch Reactor in U.S. patent application Ser. No. 08/770,092, filed Dec. 19, 1996, issue fee paid.

The chamber, illustrated in the cross-sectional view of FIG. 1, includes an arcuate ceramic dome 10 sealed to a grounded metal chamber wall 12, which is surfaced coated with boron carbide. A pedestal electrode 14 for supporting a wafer 16 to be etched is vertically raisable to seal to the bottom of the chamber wall 12 after the wafer 16 has been placed on the pedestal 14. Unilllustrated gas supply ports and a vacuum pumping port penetrate the chamber wall 12 above the sealed pedestal 14. The lower part of the chamber below the pedestal 14 is not illustrated, and the cited patents should be consulted for its details.

An inductive coil 20 is wrapped around the outer portions of the arcuate dome 10. An RF power supply 22 couples RF electrical energy into coil 20 and thence through the ceramic dome 10 into the interior of the chamber to create a plasma source region adjacent to the dome 10. A second RF power supply 24 electrically biases the pedestal electrode 14 through a capacitive coupling circuit 26 to allow a negative DC self-bias to develop on the pedestal electrode 14 relative to the plasma within the chamber. The pedestal DC bias controls the energy of ions attracted from the plasma across the plasma sheath to thereafter strike the wafer 16. One advantage of a decoupled plasma source is that the wafer bias can be controlled independently of the plasma source power.

Because electromagnetic radiation is transferred through the dome 10, the dome must be made of electrically insulating material to act as a dielectric window to allow the coil antenna 10 to couple RF energy into the plasma source region within the chamber. For chlorine-based etching of metals, for example, using $BCl_3$ to etch aluminum, ceramic alumina ($Al_2O_3$) is the typical dome material.

A recurring problem with reactor chamber walls is that, even in an etching environment, residue tends to form on the walls resulting from byproducts of the etching process. In a $BCl_3$ plasma, a brownish gold to brown film quickly forms. The residue film adhering to the chamber wall often does not inherently present major problems. However, when the film builds up to a significant thickness, portions of it are likely to flake off and fall into the processing area of the chamber. Any such particle that falls onto the wafer is likely to produce a failure or reliability problem in the integrated circuit being fabricated. In view of decreasing feature sizes of integrated circuits, a single particle as small as 0.1 $\mu$m can cause a failure. The residue particle problem seems to be particularly severe for ceramic domes used as dielectric windows for coil antennas. The source coil is intended to couple large amounts of energy into the chamber and hence is often operated at high power levels. Inevitably, a substantial fraction of the RF energy is thermally dissipated into the dome. However, the coil is only intermittently operated as wafers are cycled into and out of the chamber, and a ceramic is usually a poor thermal conductor. As a result, the dome material is subjected to repeated and significant temperature swings, resulting in repetitive cycles of thermal expansion and contraction of the dome. The thermal effects are largest in the areas immediately adjacent to the wraps of the coil. Under these conditions, the residue film is more likely to flake and produce deleterious particles.

One method to reduce the particle problem from the dome is to periodically replace it or at least clean it in situ before a critical film thickness is deposited. At a minimum, cleaning imposes significant system downtime and requires manual involvement of technicians.

Accordingly, it is greatly desired to either reduce the thickness of the film residue or to increase its adhesion to the chamber wall so that the mean time between chamber cleaning or replacement can be increased. It is further desired that such improvements be obtainable with conventional ceramic materials.

SUMMARY OF THE INVENTION

The invention may be summarized as a wall of a plasma processing chamber having formed on its interior side at least a macroscopic texturing having a size of between about 0.5 and 5 mm, for example, concentric triangular grooves. The macroscopic texturing increases the effective surface area of the dome on which residue film is deposited.

Preferably, a second, microscopic level of texturing is superimposed on the first level. The macroscopic texturing has a size of at least ten and preferably at least 100 times the size of the microscopic texturing. The microscopic texturing improves the adhesion of the residue film.

The invention is particularly useful for ceramic walls, and most particularly for ceramic domes acting as dielectric windows in plasma processing reactors for passing electromagnetic radiation from an RF coil positioned outside of the dome.

The texturing may be accomplished on the green form used in sintering the ceramic member. Grooves or other macroscopic features may be machined into the green form.

Bead blasting may be used to roughen the surface of the macroscopic features. Preferably, firing occurs after the bead blasting.

DETAILED DESCRIPTION OF THE PREFERRED EMBODIMENTS

Figure 1:
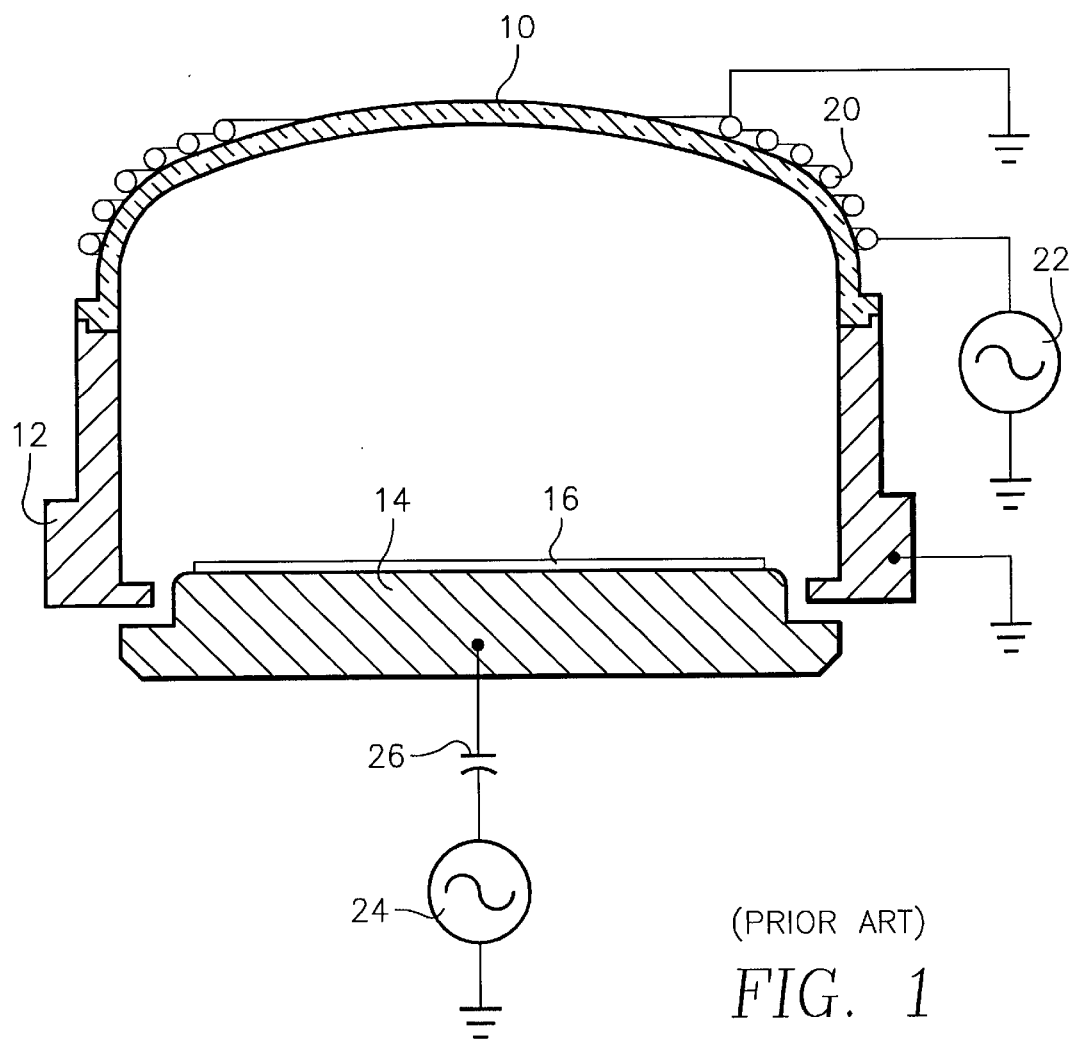
FIG. 1 is a cross-sectional view of a plasma etch reactor including a conventional ceramic dome.
Figure 2:
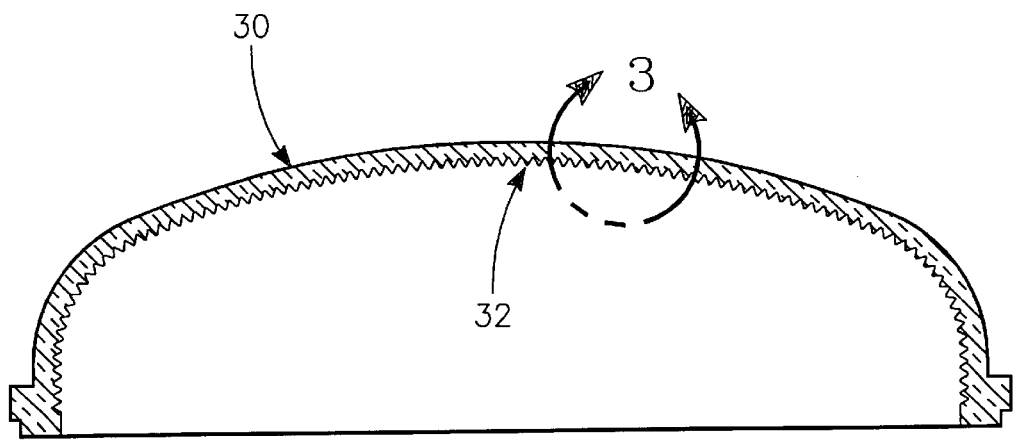
FIG. 2 is a cross-sectional view of a ceramic dome of the invention.
Figure 3:
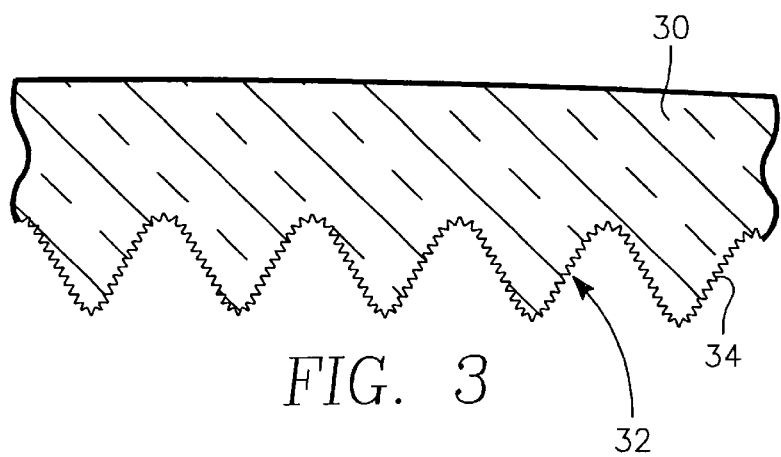
FIG. 3 is a cross-sectional view of a portion of the dome of FIG. 2 showing the combination of a wavy and roughened surface.

One embodiment of the invention is illustrated in the cross-sectional view of FIG. 2 and in the enlarged cross-sectional view of FIG. 3. A dome 30 is formed of conventional sintered alumina ($Al_2O_3$) and can be used in place of the conventional dome 10 of FIG. 1. It includes over most of its interior surface a series of concentric grooves 32 having a spacing of between 0.5 and 5 mm, preferably between 1 and 3 mm. The grooves 32 have depths of between 0.5 and 4 mm, preferably between 1 and 2 mm, in an approximately triangular shape with an apex angle of about 60°. The grooves 32 produce a macro surface texture that is characterized as wavy.

However, a micro surface texture is imposed on the wavy structure, as is illustrated in FIG. 3, by roughening the wavy structure. The roughness, which is likely to be highly irregular because of the roughening process used, is exhibited in height excursions 34 of about 1 to 5 µm on top of the macro triangular structure with about an equal period of the excursions 34. The wavy structure has a size, as expressed by its period and depth, of at least one order and preferably at least two orders of magnitude larger (10× and 100×) than the period of the roughening. The wavy structure should have a size no more than three order of magnitude larger (1000×) than the period of the roughening.

The two levels of surface texturing are believed to produce two different results that are largely separable. The micro structure is present on a very small scale, and the resultant roughness provides better adhesion to any residue film deposited on it. Even under thermal cycling, the film is likely to remain attached to areas deep in the microscopic pits between the roughened excursions 34. On the other hand, the relatively large size of the grooves 32 and the large spacing between them are less likely to contribute to increased adhesion of the residue film. However, the wavy shape provides a surface area on the interior of the dome that is two to three times larger than the surface area of a smooth dome. During plasma processing, the dome acts to getter the residues from the plasma, and it is believed that the residue deposition is limited by the available residue precursors in the plasma. As a result, the net film thickness deposited on a wavy surface should be significantly less than the thickness deposited on a smooth surface. Although the micro structure also increases the surface area, the residue film is quickly deposited to a thickness greater than the scale of the micro structure. That is, in the initial film forming period, the residues bond strongly to the microstructure but quickly build to a thickness where the microstructure is buried beneath a relatively smooth (on a micrometer scale) surface of the residue. Furthermore, the film deposited on the wavy structure has bends at the peaks and troughs of the waves. During differential thermal expansion between the residue film and the ceramic dome, the bends can accommodate a net shrinkage or expansion of the film without the film delaminating from the dome.

Two alumina domes were tested in a $BCl_3$-based etching environment under nearly identical operating conditions and elapsed operating time. The first dome was roughened but did not have a wavy surface. After a set number of cycles, the dome was removed and sectioned. The thickness of the residue film was measured at the center of the dome, at the portion of the dome underlying the inductive coil, and at the bottom edge. The experiment was repeated for a second dome having a roughened and wavy surface. The film thicknesses deposited in both dome are tabulated in TABLE 1.

TABLE 1

|  | Deposition Thickness (µm) | | |
| --- | --- | --- | --- |
|  | Center | Coil | Edge |
| Rough | 33.6 | 30.3 | 27.4 |
| Wavy, Rough | 18.2 | 16.3 | 19.9 |

It is thus seen that the net film thickness is reduced by between about 30 and 50% by use of a wavy interior surface. Similar differences in thickness were observed between unroughened samples with and without the wavy structure.

Another set of tests were performed on domes composed of yttrium aluminum garnet (YAG) having a composition of $Al_2O_3$ and $Y_2O_3$ in the proportions of about 5:3. The thickness results for YAG domes are summarized in TABLE 2.

TABLE 2

|  | Deposition Thickness (µm) | | |
| --- | --- | --- | --- |
|  | Center | Coil | Edge |
| Rough | 28.7 | 34.3 | 34.0 |
| Wavy, Rough | 15.8 | 16.7 | 17.2 |

These results show that a wavy surface in YAG domes produces an even greater reduction in film thickness.

Figure 4:
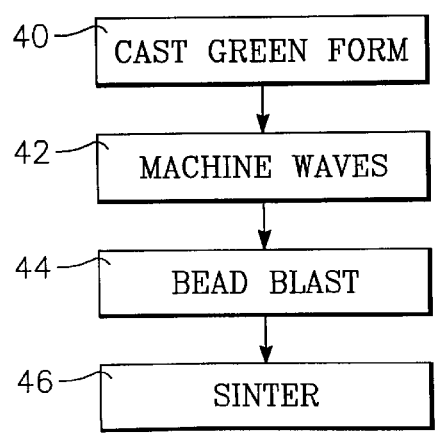
FIG. 4 is a flow diagram of one method of making the dome of FIG. 2.

A preferred method of fabricating the ceramic dome with the two levels of surface texturing is illustrated in the flow diagram of FIG. 4 and is easily integrated into a conventional process of forming ceramic domes by sintering. In step 40, a green form is cast into a mold having a shape corresponding generally to the untextured shape of the dome though somewhat larger in portions intended for machining. In sintering, for example of ceramic alumina, alumina particles in the form of a powder are combined with specialized liquids including a binder and other sintering aids to form a slightly moist powder. The powder is pressed between two sections of a mold to form the desired shape. The pressed powder, which is called a green form, has sufficient strength to be free-standing and to be machined. It is a soft article composed mostly of alumina particles held together by the binder. Other types of sintering use a wetter slurry that needs to be dried to the desired shape.

In step 42, the grooves forming the wavy macro structure are mechanically machined into most of the interior surface of the green form to face the plasma, but if residue deposition is known to be limited to a smaller area of the dome, the machining can be limited to that area. The machining may be performed on, for example, a lathe or a milling machine with a rotating bed. Machining of green forms is quite conventional and is used to form features that are too fine or convolute for easy casting. The size of the desired waves is well within the capability of machining green forms. Although a concentric set of grooves were formed in the test structures, a spiral groove would provide equally good effects and could be easily machined with computerized machining equipment. The groove machining step 42 can be combined with machining of other features in the dome structure.

Following the machining of the grooves but prior to firing, the green form in step 44 is bead blasted over substantially all of its interior surface to provide the desired degree of roughening. In the tested domes, the bead blasting produced a surface roughness of 150 to 200 Ra. The bead blasting roughens the dome surface and produces the micro texturing. The bead blasting is expected to smooth out the exposed peaks of the triangular wavy structure, but for the most part the microscopic roughness is superimposed on the existing macroscopic grooves. The bead blasting may be performed with resin beads because of the softness of the green form.

It is noted that when the bead blasting was delayed until after firing, alumina beads are needed, but they result in microcracking of the already hard sintered material.

In step 46, the roughened, wavy green form is fired in a high-temperature furnace to complete the sintering process in which all components in the green form except the alumina particles are evaporated and the alumina particles are partially consolidated to form a sintered alumina body. The firing is a conventional sintering operation, in this case performed without applying pressure to the green form being sintered. Typical sintering temperatures are 1400 to 1800° C.

Thus, it is seen that the inventive dome can be fabricated with only minor additions to the conventional sintering process of forming ceramic domes.

Bead blasting is a known technique for providing increased adhesion for deposited films although it is typically performed on hardened materials in semiconductor applications. Also, the larger macrostructure of the waves is not known to be used. In particular, the use of two levels of texturing is not known.

The procedure for forming the macro and microstructure is not limited to the process of FIG. 4, and the shapes may be different than those produced by that process. The wavy structure could be cast with more sophisticated casting processes and molds. The macrostructure can be formed in shapes other than generally concentric triangular grooves, and a two-dimensional macrostructure is possible. Bead blasting is particularly advantageous for reaching into the already formed macrostructure, but other roughening techniques may be used.

Although the invention has been described in terms of an arcuate alumina or YAG dome, the invention can be applied to other shapes and materials. Other ceramic materials can be used for plasma chambers, some of them showing particular advantages for particular etch chemistries. Quartz ($SiO_2$) is widely used for chamber bodies, though it is inappropriate for some chemistries and is being replaced in advanced reactor designs. Although the invention is particularly useful for dielectric windows, other parts of a plasma reactor can utilize the invention. Indeed, the invention is not limited to ceramics and dielectrics but can be advantageously applied to aluminum or other metal chamber walls that are subject to residue accumulation. With metals, it becomes possible to machine both the macro and micro texturing.

What is claimed is:

1. A wall adapted for use in a plasma reactor, comprising:
   a base;
   a first surface texture formed into a side of said wall facing an interior of said plasma reactor and having a period of between 0.5 and 5 mm and a depth of between 0.5 and 4 mm; and
   a second surface texture imposed upon said first surface texture and having a size between 0.1% and 10% of a size of said first surface texture.

2. The wall of claim 1, wherein said base comprises a ceramic.

3. The wall of claim 2, wherein said ceramic comprises alumina.

4. The wall of claim 2, wherein said base has a domed shape.

5. A ceramic dome formed in an arcuate shape and having on one side of said arcuate shape a first level of texturing comprising features having a period of between 0.5 and 5 mm and a depth of between 0.5 and 4 mm and a second level of texture superimposed on said first level of texturing having a size of between 0.1% and 10% of a size of said first level of texturing.

6. The ceramic dome of claim 5 formed of alumina.

7. The ceramic dome of claim 5 formed of yttrium aluminum garnet.

8. The ceramic dome of claim 5, wherein said period is between 1 and 3 mm.

9. The ceramic dome of claim 5, wherein said one side of said arcuate shape is convexly shaped.

10. A plasma processing chamber, comprising:
    a support for a substrate being processed;
    a vacuum chamber including said support;
    a dielectric window sealed to said vacuum chamber and having formed in first side thereof facing an interior of said vacuum chamber a first level of texturing having a period of between 0.5 and 5 mm and a depth of between 0.5 and 4 mm, wherein said dielectric window has formed in said first side a second level of texturing superimposed on said first level of texturing having a size of between 0.1% and 10% of a size of said first level of texturing; and
    an RF inductive coil positioned on a second side of dielectric window for coupling RF energy into said interior of said vacuum chamber to excite a plasma for processing said substrate.

11. The plasma chamber of claim 10, wherein said dielectric window comprises a ceramic.

* * * * *